(12) United States Patent
Jaw et al.

(10) Patent No.: US 6,509,198 B2
(45) Date of Patent: Jan. 21, 2003

(54) METHOD OF POWER IC INSPECTION

(75) Inventors: Kou-Liang Jaw, Hsinchu (TW); Jen-Te Chen, Hsinchu (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/969,601

(22) Filed: Oct. 4, 2001

(65) Prior Publication Data

US 2002/0055196 A1 May 9, 2002

(30) Foreign Application Priority Data

Nov. 3, 2000 (TW) .......................................... 8912356 A

(51) Int. Cl.$^7$ ............................................... H01L 21/66
(52) U.S. Cl. .......................... 438/14; 438/687; 324/752
(58) Field of Search .............................. 438/14, 15, 16, 438/687, 616; 324/752

(56) References Cited

U.S. PATENT DOCUMENTS

| | | | |
|---|---|---|---|
| 3,868,720 A | * | 2/1975 | New et al. ..................... 357/34 |
| 4,839,311 A | * | 6/1989 | Riley et al. ................... 437/228 |
| 4,846,929 A | * | 7/1989 | Bard et al. .................... 156/630 |
| 5,804,980 A | * | 9/1998 | Nikawa ........................ 324/752 |
| 5,872,051 A | * | 2/1999 | Fallon et al. ................. 438/616 |
| 6,181,662 B1 | * | 1/2002 | Krieger et al. ................. 369/70 |
| 6,376,374 B1 | * | 4/2002 | Stevens ....................... 438/687 |

\* cited by examiner

*Primary Examiner*—John F. Niebling
*Assistant Examiner*—Olivia Luk
(74) *Attorney, Agent, or Firm*—Bacon & Thomas

(57) ABSTRACT

The present invention provides a method of power IC inspection to inspect whether an electrically-failed portion of power ICs results from photo resist peeling before or during source implantation. First, the metal layers on the power ICs are removed by the conventional etching process, and then the dielectric layers on the power ICs are removed by the conventional etching process. Finally, the semiconductor substrate is put into an acid solution containing chromium (Cr), so that a close contour is shown at each of the power ICs whose photo resist didn't peel during photolithography process and after source implantation.

22 Claims, 4 Drawing Sheets

METHOD OF POWER IC INSPECTION

BACKGROUND OF THE INVENTION

1. Field of the Invention

The present invention relates to a method of power IC inspection, more particularly, to a method applied to inspect whether electrically-failed power ICs results from photo resist peeling before or during source implantation.

2. Description of the Related Art

Vigorous developments of power ICs are now under way. First refer to FIG. 1 and FIG. 2, which represent the schematic cross-sectional diagram and top-view diagram of power ICs, respectively. The power IC is formed on a semiconductor substrate 10. The gate 12 of the power IC is formed in a deep trench by performing a series of conventional photolithography, anisotropic etching step, and chemical vapor deposition. The source 14 of the power IC 14 is formed by first coating a photo resist layer 16, defining the region of source 14 by photolithography process, and then ion-implanting N-impurities (for NMOS) or P-impurities (for PMOS) into the semiconductor substrate 10. The undoped region 18 between source and drain is not ion-implanted because the photo resist layer 16 serves as a hard mask during source implantation.

However, the photo resist layer 16 might peel during the photolithography process. As a result, the undoped region 18 is ion-implanted during source implantation because of no hard mask. As a result, the breakdown voltage of source 14 to drain 20 is too poor to well work.

In order to avoid from ion-implanting in error, it would be the best to inspect the photo resist layer 16 before or after source implantation. In the present semiconductor industry, only optical scanners of KLA-Tencor can inspect the pattern of the photo resist layer 16 automatically. However, the optical scanners of KLA-Tencor are with very low throughput. For this reason, only few semiconductor substrates can be sampled in the real application. As a result, some of electrically-failed power ICs resulted from photo resist peeling will be released from inspection until final electrical test.

There are lots of potential reasons resulting in the failure of the electrically-failed power ICs. In the present, there is no method which can verify whether the failure of the electrically-failed power ICs results from photo resist peeling. This issue embarrasses both of the QC (Quality Control) people and the process people.

SUMMARY OF THE INVENTION

The main purpose of the present invention is to provide a method of power IC inspection to inspect whether a electrically-failed portion of power ICs results from photo resist peeling during photolithography process during source implantation process.

The present invention provides a method of power IC inspection to inspect whether electrically-failed power ICs results from photo resist peeling during source implantation. First, the hot spots on the semiconductor substrate 10 are recovered by performing liquid crystal experiment. After that, each of the electrically-failed power ICs manufactured on the semiconductor substrate 10 is laser-marked according to the hot spots.

Thereafter, the metal layers on the power ICs are removed by the conventional etching process, and then the dielectric layers on the power ICs are also removed by the conventional etching process. Finally, the semiconductor substrate 10 is put into an acid solution containing chromium (Cr), so that a close contour is shown at each of the power ICs whose photo resist layer didn't peel during photolithography process during source implantation process.

The acid solution containing chromium (Cr) is $HNO_3$/$HF$/$CrO_3$/$H_2O$ solution. The $HNO_3$/$HF$/$CrO_3$/$H_2O$ solution is prepared by first dissolving 50 grams of $CrO_3$ solution into 400 ml of water, and then inputting 96% of 100 ml of $CrO_3$ solution and 49% of 300 ml of HF into the water. According to one embodiment of the present invention, the semiconductor substrate 10 is input into the $HNO_3$/$HF$/$CrO_3$/$H_2O$ solution for 10 to 20 seconds. According to another embodiment of the present invention, the semiconductor substrate 10 is input into the $HNO_3$/$HF$/$CrO_3$/$H_2O$ solution for 15 seconds.

DESCRIPTION OF THE PREFERRED EMBODIMENT

The present invention relates to a method of power IC inspection, more particularly, to a method applied to inspect whether the electrically-failed power ICs results from photo resist peeling before or during source implantation. The present invention is applicable when the electronically-inspection yield of power ICs significantly decreases. For the electrically failed power ICs, there are lots of reasons to make them fail. The present invention provide a method to verify whether the decrease of yield results from photo resist peeling during photolithography process before source implantation.

Figure 1:
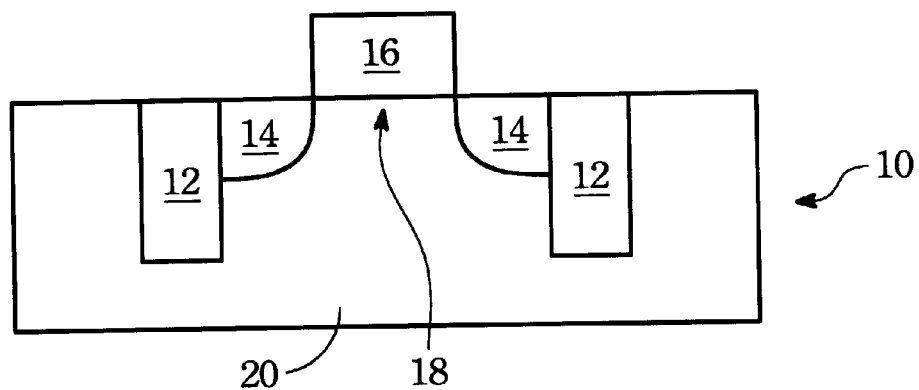
FIG. 1 represent the conventional cross-sectional diagram of power ICs.
Figure 2:
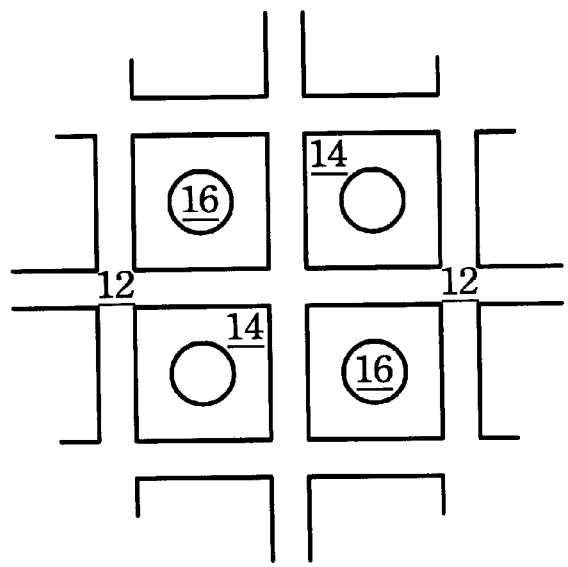
FIG. 2 represent the conventional top-view diagram of power ICs.
Figure 3A:
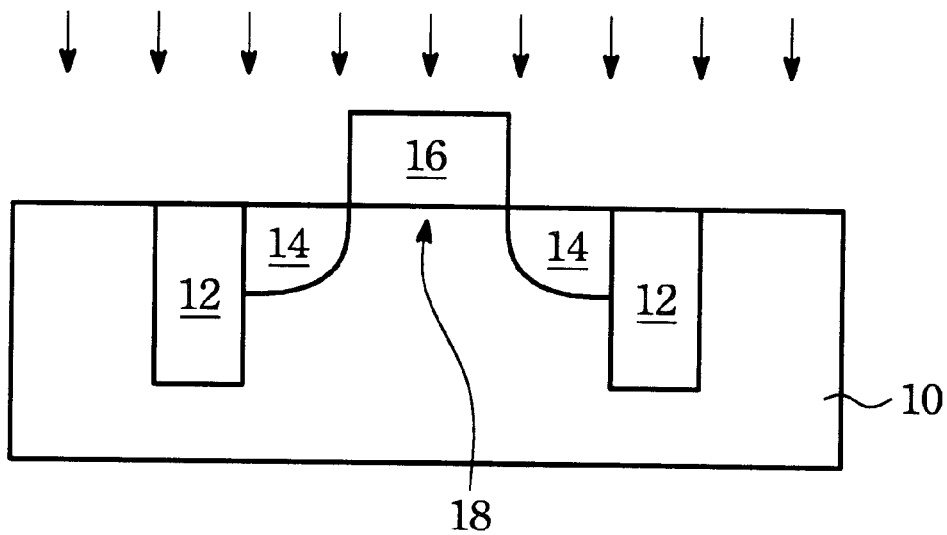
FIG. 3A represents the schematic cross-sectional diagram of power IC whose photo resist layer didn't peel during source implantation.
Figure 3B:
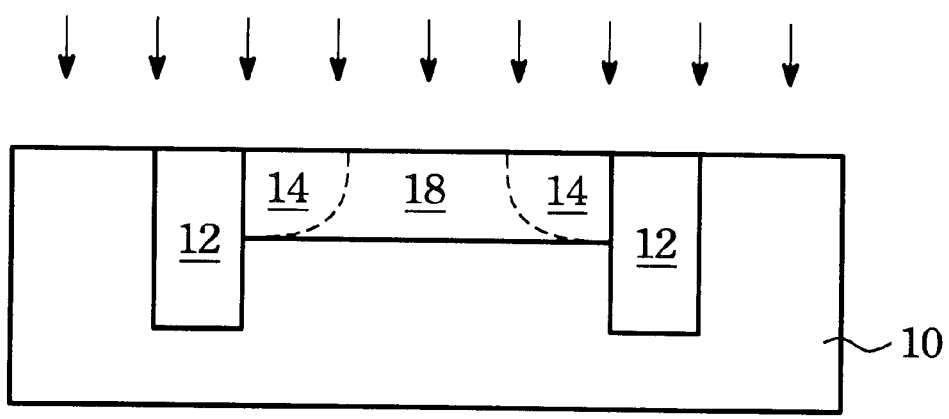
FIG. 3B represents the schematic cross-sectional diagram of power IC whose photo resist layer peeled before or during source implantation.

Referring first to FIG. 3, the schematic cross-sectional diagram of power ICs is shown. FIG. 3A represents the schematic cross-sectional diagram of power IC whose photo resist layer didn't peel before source implantation; FIG. 3B represents the schematic cross-sectional diagram of power IC whose photo resist layer peeled before source implantation.

In FIG. 3A, the power IC is manufactured in a semiconductor substrate 10. The gate electrode 12 of the power IC is formed in a deep trench by performing a series of conventional photolithography process, anisotropic etching step and chemical vapor deposition process. The source 14 of the power IC is manufactured by first coating a photo resist layer 16 on the semiconductor substrate 10. After defining the position of source 14 by performing a photolithography process, the source 14 of the power IC is formed by ion-implanting N-type impurities into the semiconductor substrate 10. Because the photo resist layer 16 serves as hard mask during the ion implantation process, the undoped region 18 between source and drain is not ion-implanted.

On the other hand, FIG. 3B shows schematic cross-sectional diagram of the electrically-failed power IC. Because the photo resist layer 16 peeled before or during the ion implantation step for forming source 14, the undoped region 18 inside the source is also ion-implanted during source implantation. As a result, the breakdown voltage of source 14 to drain 20 is too poor to well work.

Figure 4:
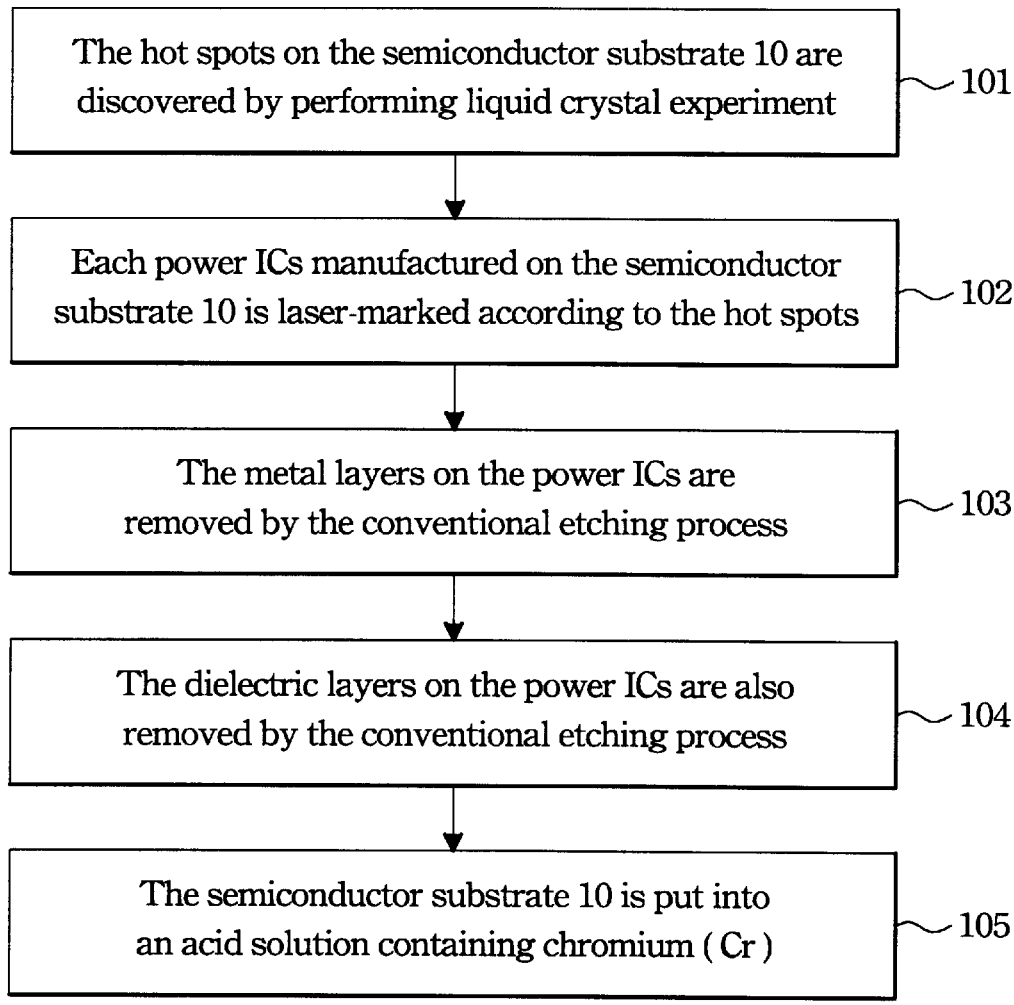
FIG. 4 shows the process flow of the method of power IC inspection in accordance with the present invention.

Referring now to FIG. 4, the process flow of the method of power IC inspection is shown. First, the hot spots on the semiconductor substrate 10 are discovered by performing liquid crystal experiment (step 101). After that, each power ICs manufactured on the semiconductor substrate 10 is laser-marked according to the hot spots (step 102).

Thereafter, the metal layers on the power ICs are removed by the conventional etching process (step 103), and then the dielectric layers on the power ICs are also removed by the conventional etching process (step 104). Finally, the semiconductor substrate 10 is put into an acid solution containing chromium (Cr) (step 105), so that a close contour is shown at each of the power ICs whose photo resist didn't peel before and after source implantation. The close contour could be a round-shaped contour or an elliptical contour, depending on the layout of the power ICs. On the other hand, no contour is shown at the power ICs whose photo resist peeled before or after source implantation.

About the step of removing the metal layers on the power ICs, the semiconductor substrate 10 is first input into a solution composed of $HNO_3/CH_3COOH/H_3PO_4/H_2O$ under a temperature ranged between 40 to 45° C. until bubbles are no more generated. The $HNO_3/CH_3COOH/H_3PO_4/H_2O$ solution has a composition ratio of 1:1:17:1. The semiconductor substrate 10 is then rinsed by using DI water. After that, the semiconductor substrate 10 is input into a solution composed of $HCl/H_2O_2/H_2O$ for 1 to 3 minutes, and then rinsed by using DI water. The $HCl/H_2O_2/H_2O$ solution has a composition ratio of 1:5:3. Thereafter, the semiconductor substrate 10 is input into a solution composed of $H_2SO_4/H_2O$ for 1 to 3 minutes, and then rinsed by using DI water. The $H_2SO_4/H_2O$ solution has a composition ratio of 1:1.

According to another embodiments of the present invention, the recipe mentioned above can be replaced by other acid solutions, such as 5% dilute HF solution, $HNO_3$ solution accompanied by supersonic vibration, $HCl/H_2O_2$ solution with 1:1 ratio accompanied by supersonic vibration, $H_2SO_4/H_2O_2$ solution with 1:1 ratio accompanied by supersonic vibration, and so on.

About the step of removing the dielectric layers on the power ICs, the semiconductor substrate 10 is first input into a $HF/H_2O$ solution with a composition ratio of 1:9 for 12 to 20 minutes. According to another embodiment of the present invention, the semiconductor substrate 10 is first input into a $HF/H_2O$ solution with a composition ratio of 1:9 for 16 minutes. The semiconductor substrate 10 is then rinsed by using DI water.

The acid solution containing chromium (Cr) is $HNO_3/HF/CrO_3/H_2O$ solution. The $HNO_3/HF/CrO_3/H_2O$ solution is prepared by first dissolving 50 grams of $CrO_3$ into 400 ml of water, and then inputting 96% of 100 ml of $CrO_3$ and 49% of 300 ml of HF into said water. According to one embodiment of the present invention, the semiconductor substrate 10 is input into the $HNO_3/HF/CrO_3/H_2O$ solution for 10 to 20 seconds. According to another embodiment of the present invention, the semiconductor substrate 10 is input into the $HNO_3/HF/CrO_3/H_2O$ solution for 15 seconds.

Figure 5:
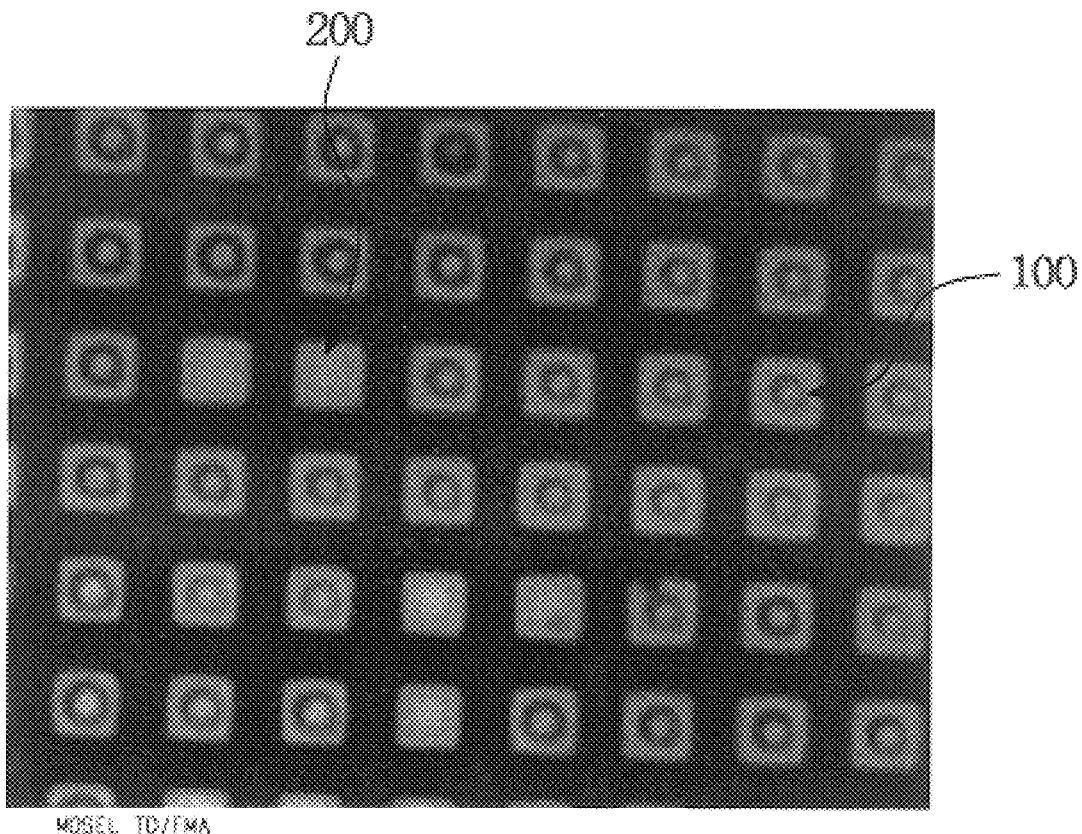
FIG. 5 is an optical microscope diagram of power IC inspection for a substrate containing normal power ICs and electrically-failed power ICs according to the method of the present invention.

Within the $HNO_3/HF/CrO_3/H_2O$ solution, $HNO_3$ is applied to oxidize the semiconductor substrate to form a layer of silicon dioxide, and HF is then applied to remove the layer of silicon dioxide. $CrO_3$ is the most important one, whose etching rate for etching N-doped silicon substrate is slower than that for etching P-doped silicon substrate. For the normal power IC represented in FIG. 3A, the undoped region 18 within P-well keeps P-type, because the photo resist layer 16 serves as hard mask during source implantation. Because source 14 is N-type, the etching rate of $HNO_3/HF/CrO_3/H_2O$ solution for etching source 14 is slower than that for etching the undoped region 18. For this reason, each of the normal power ICs emerges a close contour after dipping into the $HNO_3/HF/CrO_3/H_2O$ solution, as shown by the array 100 in FIG. 5. FIG. 5 is an optical microscope diagram of power IC inspection for a substrate containing normal power ICs and electrically-failed power ICs according to the method of the present invention.

On the other hand, for the electrically-failed power ICs represented in FIG. 3B, the undoped region 18 within P-well becomes N-type during source implantation because the photo resist layer peeled before or during source implantation. As a result, the etching rate of $HNO_3/HF/CrO_3/H_2O$ solution for etching source 14 is the same as that for etching the undoped region 18. For this reason, each of the electrically-failed power ICs emerges no close contour after dipping into the $HNO_3/HF/CrO_3/H_2O$ solution, as shown by the array 200 in FIG. 5.

According to the reasons mentioned above, the present invention provides a method of power IC inspection to inspect whether a electrically-failed portion of the power ICs results from photo resist peeling during photolithography process before or during source implantation process.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. A method of power IC inspection for a number of power ICs manufactured on a semiconductor substrate, wherein said method is applied to inspect whether an electrically-failed portion of said power ICs results from photo resist peeling before or during source implantation, comprising:

a. removing metal layers on said power ICs;
   b. removing dielectric layers on said power ICs; and
   c. putting said semiconductor substrate into an acid solution containing chromium (Cr); whereby a close contour is shown at each of said power ICs whose photoresist did not peel before and during source implantation.

2. The method of claim 1, wherein said acid solution is $HNO_3/HF/CrO_3/H_2O$ solution.

3. The method of claim 1, wherein said $HNO_3/HF/CrO_3/H_2O$ solution is prepared by first dissolving 50 grams of $CrO_3$ into 400 ml of water, and then inputting 96% of 100 ml of $CrO_3$ and 49% of 300 ml of HF into said water.

4. The method of claim 1, before said step of removing metal layers on said power ICs further comprising:

recovering hot spots on said semiconductor substrate by performing liquid crystal experiment; and
   laser-marking each of said electrically-failed portion of said power ICs according to said hot spots.

5. The method of claim 1, wherein said close contour is a round-shaped contour.

6. The method of claim 1, wherein said close contour depends on the photolithography process.

7. The method of claim 1, wherein said step of removing metal layers on said power ICs comprises:
   a. inputting said semiconductor substrate into a solution composed of $HNO_3/CH_3COOH/H_3PO_4/H_2O$ under a temperature ranged between 40 to 45° C. until bubbles are no more generated; and then rinsing said semiconductor substrate by using DI water;
   b. inputting said semiconductor substrate into a solution composed of $HCl/H_2O_2/H_2O$ for 1 to 3 minutes, and then rinsing said semiconductor substrate by using DI water;
   c. inputting said semiconductor substrate into a solution composed of $H_2SO_4/H_2O$ for 1 to 3 minutes, and then rinsing said semiconductor substrate by using DI water.

8. The method of claim 7, wherein said $HNO_3/CH_3COOH/H_3PO_4/H_2O$ solution has a composition ratio of 1:1:17:1.

9. The method of claim 7, wherein said $HCl/H_2O_2/H_2O$ solution has a composition ratio of 1:5:3.

10. The method of claim 7, wherein said $H_2SO_4/H_2O$ solution has a composition ratio of 1:1.

11. The method of claim 1, wherein said step of removing dielectric layers on said power ICs is composed of inputting said semiconductor substrate into a $HF/H_2O$ solution for 12 to 20 minutes, and then rinsing said semiconductor substrate by using DI water.

12. The method of claim 11, wherein said $HF/H_2O$ solution has a composition ratio of 1:9.

13. A method of power IC inspection for a number of power ICs manufactured on a semiconductor substrate, wherein said method is applied to inspect whether an electrically-failed portion of said power ICs results from photo resist peeling before or during source implantation, comprising:
   a. discovering hot spots on said semiconductor substrate by performing liquid crystal experiment and then laser-marking each of said electrically-failed portion of said power ICs according to said hot spots;
   b. removing metal layers on said power ICs;
   c. removing dielectric layers on said power ICs;
   d. putting said semiconductor substrate into a $HNO_3/HF/CrO_3/H_2O$ solution;

whereby a close contour is shown at each of said power ICs whose photoresist did not peel during photolithography process before and during source implantation, and no contour is shown at each of said power ICs whose photoresist peeled before or during source implantation.

14. The method of claim 13, wherein said $HNO_3/HF/CrO_3/H_2O$ solution is prepared by first dissolving 50 grams of $CrO_3$ into 400 ml of water, and then inputting 96% of 100 ml of $CrO_3$ and 49% of 300 ml of HF into said water.

15. The method of claim 13, wherein said close contour is with the shape defined by the photolithography process.

16. The method of claim 13, wherein said close contour is an elliptical contour.

17. The method of claim 13, wherein said step of removing metal layers on said power ICs comprises:
   a. inputting said semiconductor substrate into a solution composed of $HNO_3/CH_3COOH/H_3PO_4/H_2O$ under a temperature ranged between 40 to 45° C. until bubbles are no more generated; and then rinsing said semiconductor substrate by using DI water;
   b. inputting said semiconductor substrate into a solution composed of $HCl/H_2O_2/H_2O$ for 1 to 3 minutes, and then rinsing said semiconductor substrate by using DI water;
   c. inputting said semiconductor substrate into a solution composed of $H_2SO_4/H_2O$ for 1 to 3 minutes, and then rinsing said semiconductor substrate by using DI water.

18. The method of claim 17, wherein said $HNO_3/CH_3COOH/H_3PO_4/H_2O$ solution has a composition ratio of 1:1:17:1.

19. The method of claim 17, wherein said $HCl/H_2O_2/H_2O$ solution has a composition ratio of 1:5:3.

20. The method of claim 17, wherein said $H_2SO_4/H_2O$ solution has a composition ratio of 1:1.

21. The method of claim 13, wherein said step of removing dielectric layers on said power ICs is composed of inputting said semiconductor substrate into a $HF/H_2O$ solution for 12 to 20 minutes, and then rinsing said semiconductor substrate by using DI water.

22. The method of claim 21, wherein said $HF/H_2O$ solution has a composition ratio of 1:9.

* * * * *